United States Patent
Hsu

(12) 
(10) Patent No.: US 6,180,516 B1
(45) Date of Patent: Jan. 30, 2001

(54) METHOD OF FABRICATING A DUAL DAMASCENE STRUCTURE

(75) Inventor: Chen-Chung Hsu, Taichung (TW)

(73) Assignee: United Microelectronics Corp,, Hsinchu (TW)

( * ) Notice: Under 35 U.S.C. 154(b), the term of this patent shall be extended for 0 days.

(21) Appl. No.: 09/187,023

(22) Filed: Nov. 5, 1998

(51) Int. Cl.[7] .............................................. H01L 21/4763
(52) U.S. Cl. ..................... 438/638; 438/640; 438/701; 438/702
(58) Field of Search ..................... 438/638, 640, 438/701, 702, 725, 703

(56) References Cited

U.S. PATENT DOCUMENTS 5,604,156 * 2/1997 Chung et al. .
5,741,626 * 4/1998 Jain et al. .............................. 430/314
5,858,877 * 1/1999 Dennison et al. ..................... 438/700

* cited by examiner

*Primary Examiner*—Caridad Everhart
(74) *Attorney, Agent, or Firm*—Hickman Coleman & Hughes, LLP

(57) ABSTRACT

The present invention provides an improved method of forming a dual damascene structure. Patterns of a metallic trench and a via hole are formed by using the photolithography process twice. After the first etching step of the dielectric layer the first photoresist layer is not removed. Thus, the first photoresist layer is used with the second photoresist layer as masks in the second etching step of the dielectric layer. The self-aligned method of forming a dual damascene structure thus is provided. In addition, a titanium layer or a titanium nitride layer can be formed on the dielectric layer after the first etching step of the dielectric layer and is used as an anti-reflection layer.

6 Claims, 6 Drawing Sheets

METHOD OF FABRICATING A DUAL DAMASCENE STRUCTURE

BACKGROUND OF THE INVENTION

1. Field of the Invention

The present invention relates to a method of forming multilevel interconnects that are used to interconnect semiconductor devices. More particularly, the present invention relates to a method of forming a dual damascene structure.

2. Description of the Related Art

Dual damascene process is an ingenious technology that embeds metallic interconnects in an isolation layer. The method of forming a dual damascene structure includes forming an isolation layer on a dielectric layer at first, and then planarizing the isolation layer. The isolation layer is etched to form horizontal trenches and vertical vias according to the predetermined metallic line pattern and positions of via holes. A metallic layer is deposited over the dielectric layer to fill the horizontal trenches and the vertical vias, and then metallic lines and vias are formed simultaneously. Subsequently, a chemical-mechanical polishing (CMP) step is performed to planarize the device surface. The dual damascene structure thus is completed. In contrast with the conventional process, which forms vias and metallic lines separately, the dual damascene process forms vias and metallic lines simultaneously. Therefore, overlay errors or process bias arising from mask misalignments does not happened, and the reliability of devices can be improved. With the trend toward high integration density, dual damascene process is widely adopted in the semiconductor industry.

FIGS. 1A through 1E are schematic, cross-sectional views showing a conventional fabricating method of a dual damascene structure.

In FIG. 1A, a dielectric layer 100 having a metallic layer 102 therein is provided. An inter-metal dielectric (IMD) layer 104 is formed on the dielectric layer 100 and the metallic layer 102. The inter-metal dielectric layer 104 is planarized by chemical-mechanical polishing. To prevent reflection by the metallic layer 102. An antireflection layer 105 is formed on the inter-metal dielectric layer 104. The anti-reflection layer 105 is used to prevent reflection by the metallic layer 102.

In FIG. 1B, a first patterned photoresist layer 110 is formed on the anti-reflection layer 105. The first patterned photoresist layer 110 is used as an etching mask. The anti-reflection layer 105 and the inter-metal dielectric layer 104 are patterned to form an opening 108 in the inter-metal dielectric layer 104 until the metallic layer 102 is exposed. The first photoresist layer 110 is removed.

In FIG. 1C, a second patterned photoresist layer 112 is formed on the antireflection layer 105. The second patterned photoresist layer 112 is used as an etching mask.

In FIG. 1D, the anti-reflection layer 105 and the inter-metal dielectric layer 104 are patterned again to form trenches 114 and 116. The trench 114 is formed above the metallic layer 102. A dual damascene structure opening 118 is formed by the trench 114 together with the residual opening 108a. The second photoresist layer 112 is removed.

In FIG. 1E, a conductive layer (not shown) is deposited over the dielectric layer 100 to fill the dual damascene structure opening 118 and the trench 116. The conductive layer is planarized to form a dual damascene structure 120 and a metallic line 122 by chemical mechanical polishing. Conventionally, the material of the conductive layer can be aluminum or tungsten with a titanium/titanium nitride composite layer underneath used as a barrier layer/glue layer.

In the conventional process described in FIGS. 1A through 1E, no any other layers serve as an etching stop layer while etching the inter-metal dielectric layer 104 to form the trenches 114 and 116. Consequently, it is difficult to control the depth of the trenches 114 and 116. Hence, ultimate electrical properties of devices can vary considerably.

FIGS. 2A through 2E are schematic, cross-sectional views showing the other conventional fabricating method of a dual damascene structure.

In FIG. 2A, a dielectric layer 200 having a first metallic layer 202 therein is provided. A dielectric layer 204a is formed on the dielectric layer 200. The dielectric layer 204a is planarized to reach a thickness the same as the predetermined depth of a via hole. A silicon nitride layer 206, which is used as an etching stop layer, is formed on the dielectric layer 204a.

In FIG. 2B, a first patterned photoresist layer 210 is formed on the silicon nitride layer 206. The first patterned photoresist layer 210 is used as an etching mask. The silicon nitride layer 206 is etched to form an opening 208. The opening 208 is formed above the location where a via hole is desired to locate in. The opening 208 is formed just above the metallic layer 202.

In FIG. 2C, a second dielectric layer 204b and an anti-reflection layer 205 are formed in order over the dielectric layer 200. The thickness of the dielectric layer 204b is same as the predetermined thickness of the second metallic layer (metallic line) in a dual damascene structure.

In FIG. 2D, a patterned photoresist layer 212 is formed on the anti-reflection layer 205. The patterned photoresist layer 212 is used as an etching mask. The dielectric layer 204b is etched to form trenches 214a and 216. The silicon nitride layer 206 is used as an etching stop layer. The dielectric layer 204a is etched to form an opening 214b that exposes the first metallic layer 202. A dual damascene structure opening 214 is formed by the trench 214a together with the opening 214b.

In FIG. 2E, the second patterned photoresist layer 212 is removed. A conductive layer (not shown) is deposited over the dielectric layer 200 to fill the opening 214 and the trench 216. The conductive layer is planarized to form a dual damascene structure 220 and a metallic line 222. Typically, the material of the conductive layer can be aluminum or tungsten with a titanium/titanium nitride composite layer underneath serving as a barrier layer/glue layer.

In the conventional process described in FIGS. 2A through 2E, it is necessary to select a material, which provides a high selectivity of etching rate compared with the dielectric layer 204a, for the etching stop layer 206. Conventionally, the silicon oxide is used as the dielectric layer 204a and silicon nitride is used as the etching stop layer 206. The etching selectivity of etching step must be good enough to control the depth of trench 216 while etching the silicon oxide dielectric layer 204a to form the opening 214b. However, the dielectric constant of silicon nitride is higher than the dielectric constant silicon oxide. It can lead to a higher parasitic capacitance. Moreover, a silicon nitride etching stop layer 206 can create internal stress large enough to cause cracks and peeling at the interface between the silicon oxide dielectric layer 204a and the silicon nitride etching stop layer. In some cases, the use of high temperature in subsequent processing operations may give rise to serious distortion of the dielectric layer 200 that may cause some problems in the following photolithography process.

SUMMARY OF THE INVENTION

Accordingly, the present invention provides a method of forming dual damascene structure that does not require the formation of a silicon nitride etching stop layer, which has a lower etching rate relative to an oxide dielectric layer. Consequently, problems such as parasitic capacitance and internal stress due to the presence of a silicon nitride layer can be avoided. Moreover, thickness of metallic lines and depths of via holes in a dual damascene structure can be controlled more effectively.

Another aspect of the invention is to provide a simplified method of fabricating a dual damascene structure by using photolithography and etching process twice to from the metallic trenches and via hole patterns.

One further aspect of the invention is to provide a self-aligned method of forming a dual damascene structure. Hence, the reliability of the manufacturing process is increased.

To achieve these and other advantages and in accordance with the purpose of the invention, as embodied and broadly described herein, the invention provides a method of fabricating a dual damascene structure. The method comprises the steps of providing a dielectric layer having a first conductive layer therein. A dielectric layer formed on the dielectric layer and the first conductive layer. A first photoresist layer having a first opening therein is formed on the dielectric layer. The first photoresist layer is used as an etching mask. The dielectric layer is etched to a certain depth to form a trench. A titanium layer (or a titanium nitride layer) is formed over the dielectric layer to cover the first photoresist layer and the dielectric layer. A second photoresist layer having a second opening therein is formed on the titanium layer. The second photoresist layer and the first photoresist layer are used as masks. The titanium layer and the dielectric layer is etched until exposing the first conductive layer to from a via hole. The first photoresist layer and the second photoresist layer are removed. The titanium layer is removed simultaneously. A second conductive layer is formed to fill the via hole and the trench. The second conductive layer is planarized until exposing the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
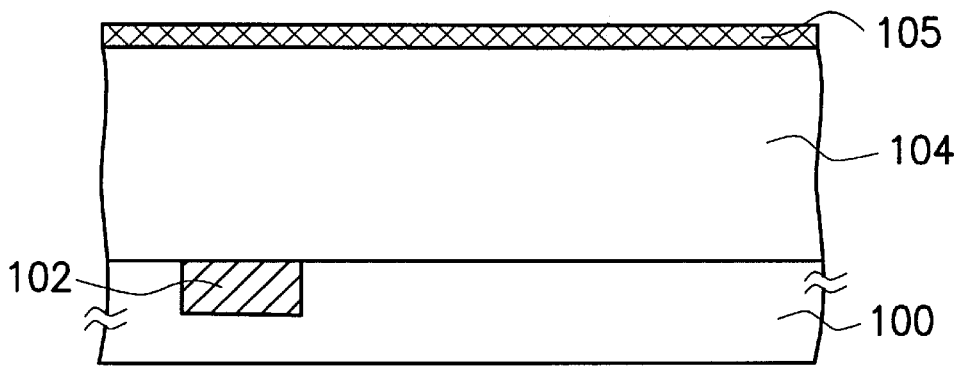
FIGS. 1A through 1E are schematic, cross-sectional views showing a conventional fabricating method of a dual damascene structure.
Figure 1B:
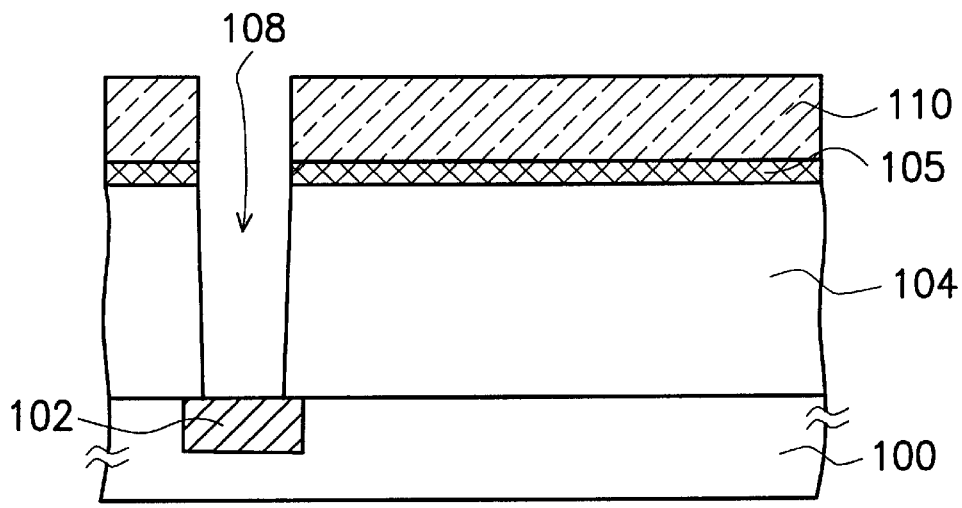
Figure 1C:
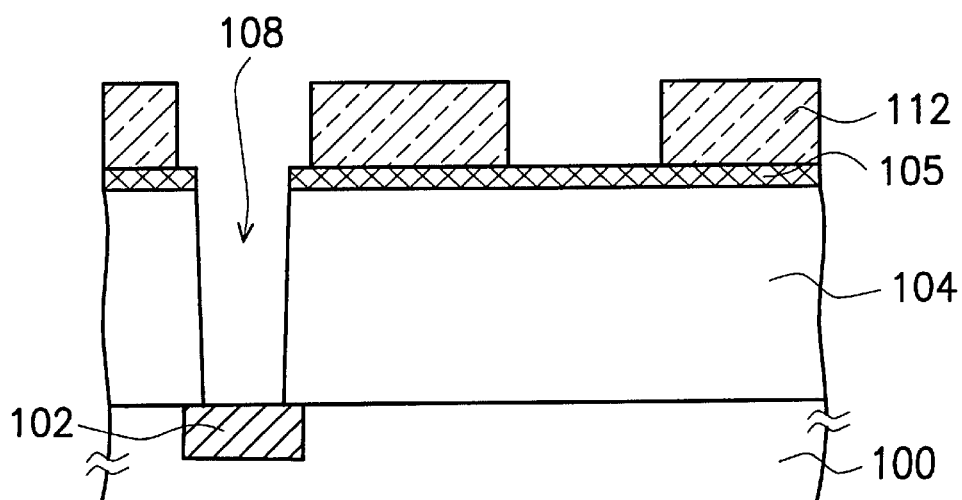
Figure 1D:
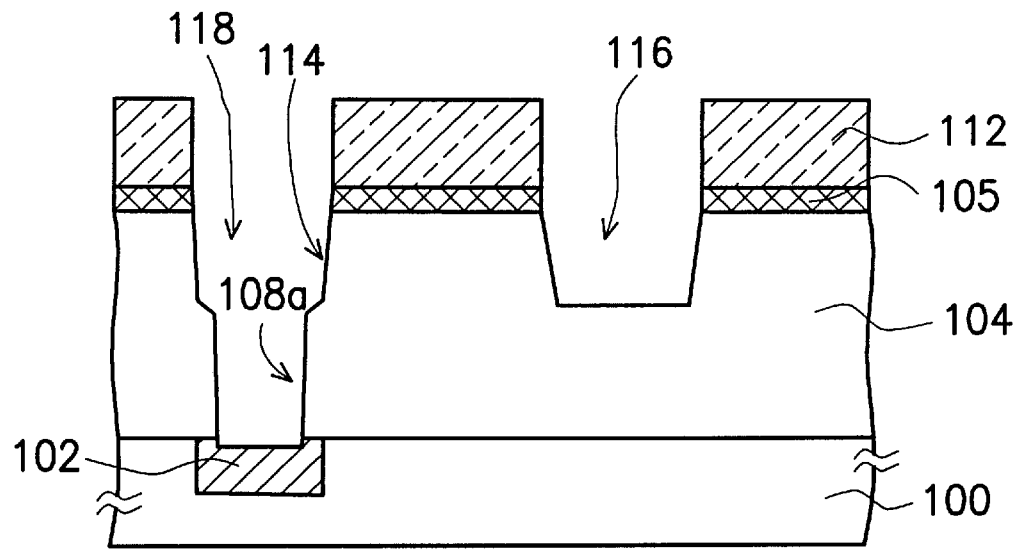
Figure 1E:
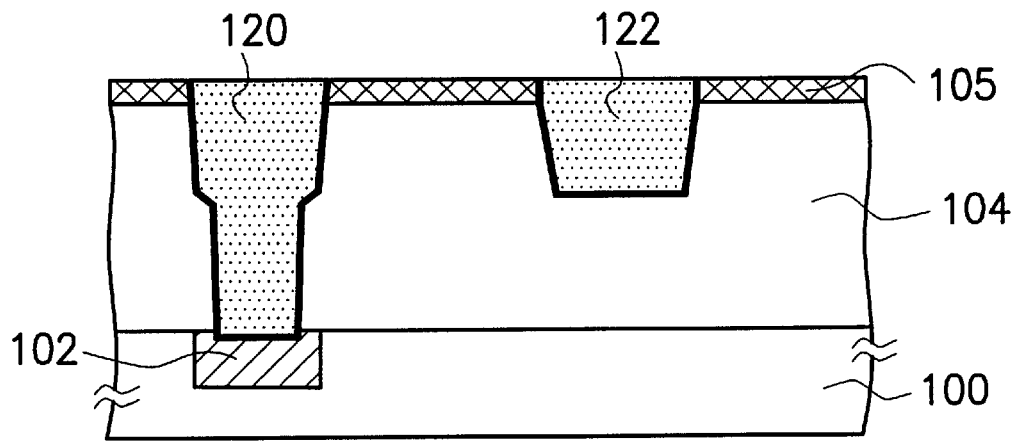
Figure 2A:
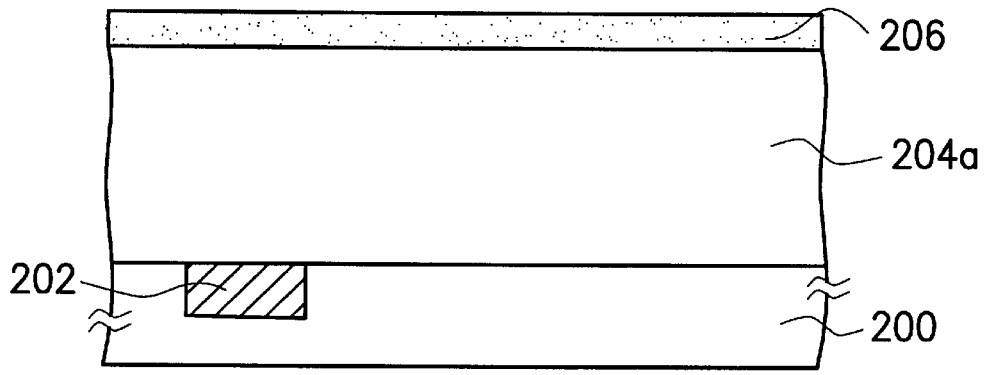
FIGS. 2A through 2E are schematic, cross-sectional views showing the other conventional fabricating method of a dual damascene structure.
Figure 2B:
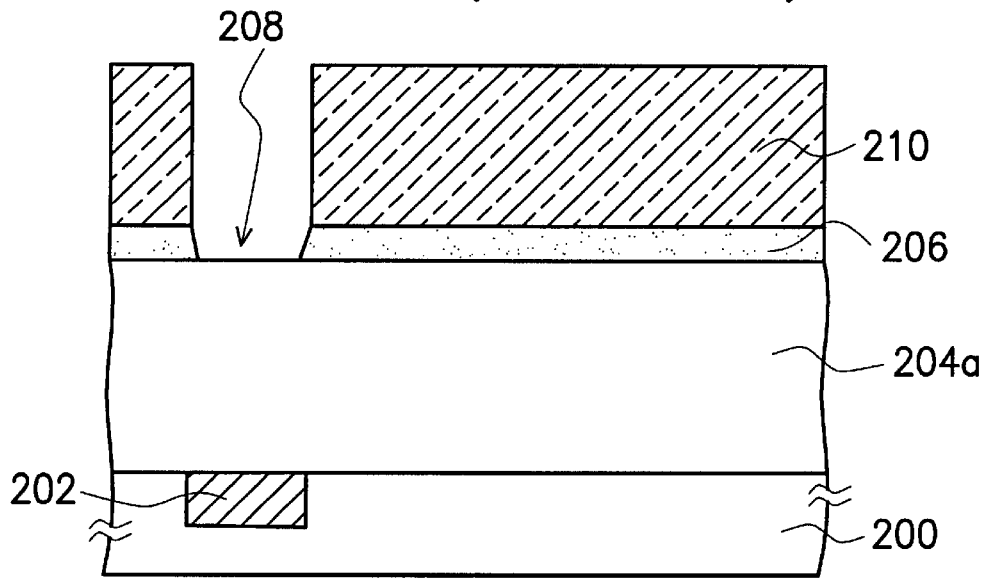
Figure 2C:
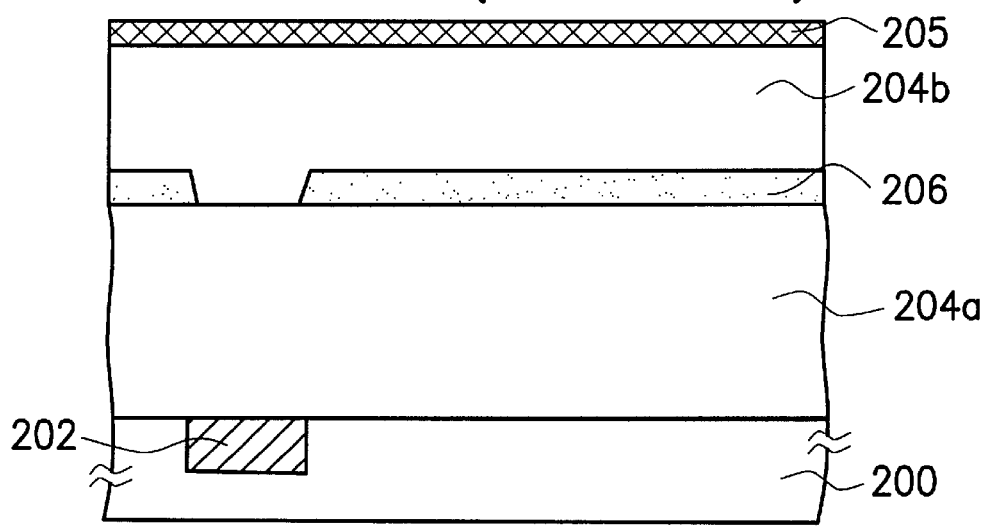
Figure 2D:
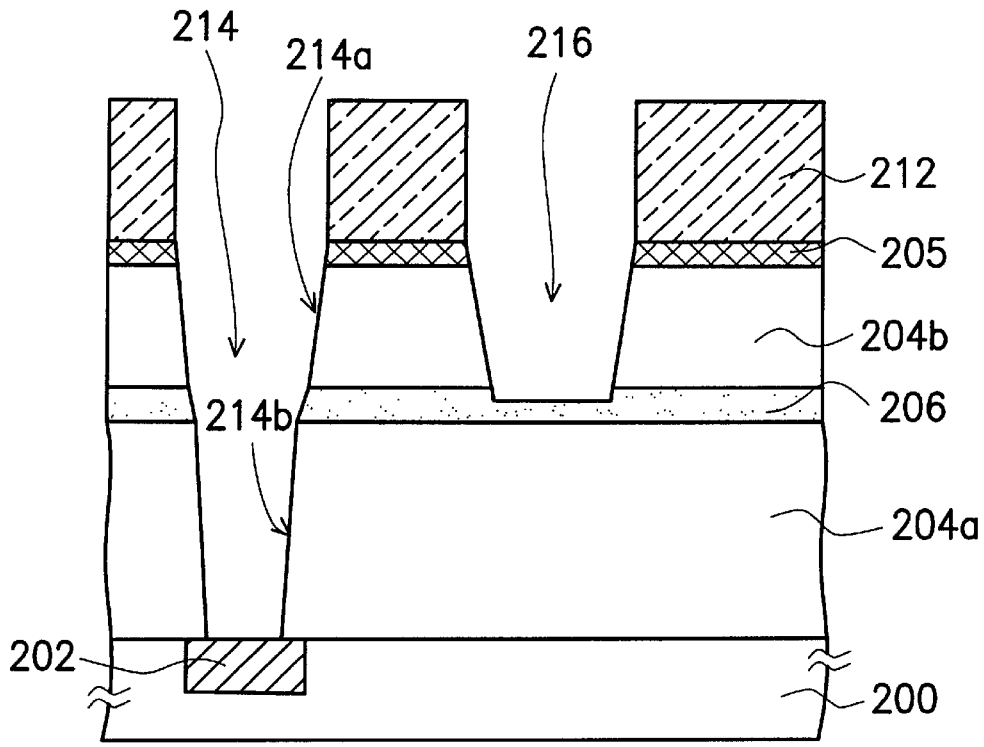
Figure 2E:
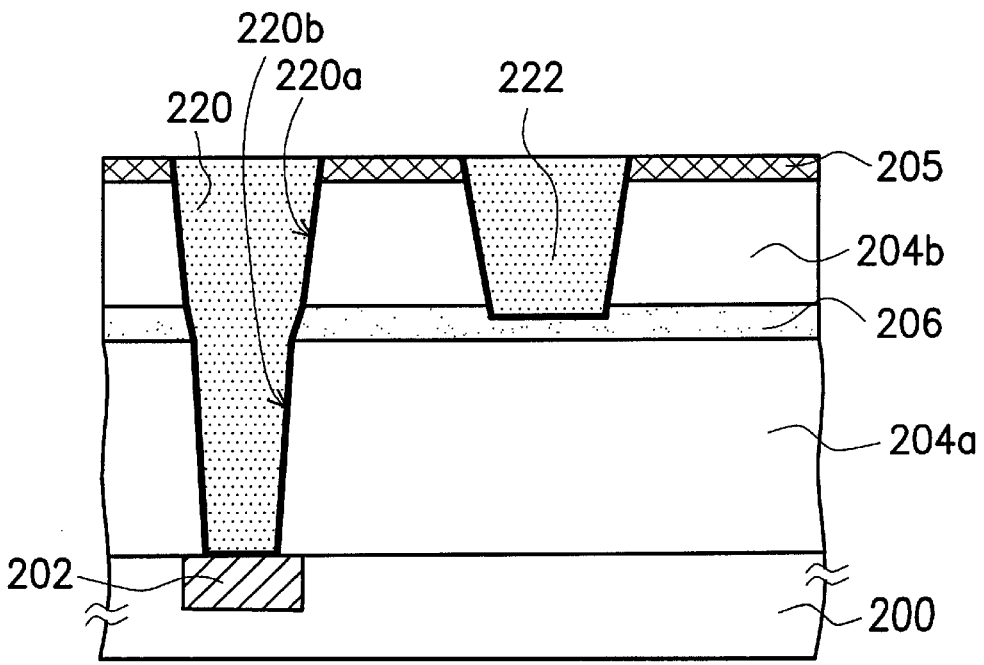

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are schematic, cross-sectional views showing a fabricating method of a dual damascene structure according to one preferred embodiment of the invention.

Figure 3A:
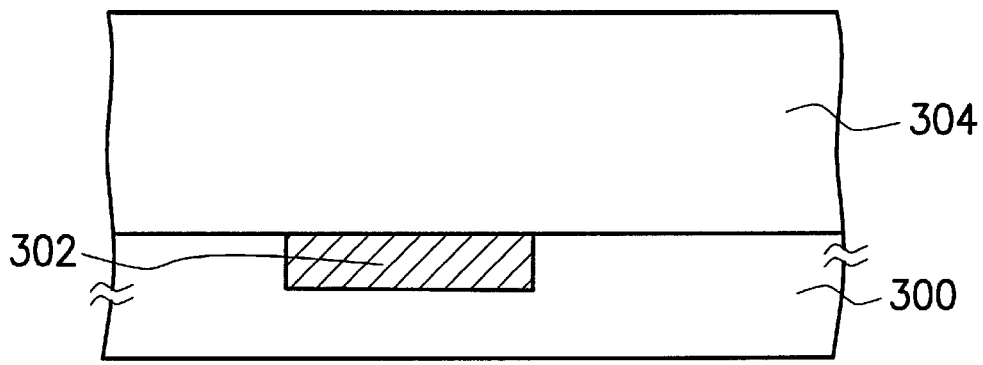
FIGS. 3A through 3E are schematic, cross-sectional views showing a fabricating method of a dual damascene structure according to one preferred embodiment of the invention.
Figure 3B:
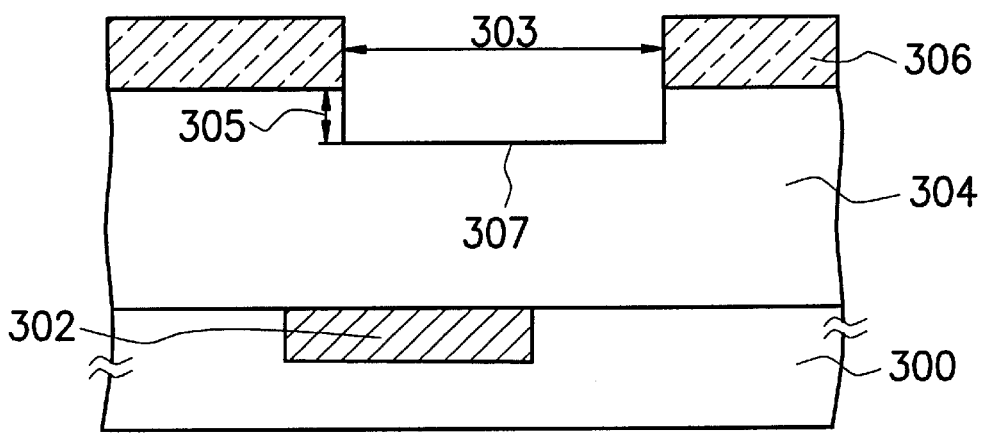

In FIG. 3A, a dielectric layer 300 having a first conductive layer (or a metallic layer) 302 therein is provided. A dielectric layer (or an inter-metal dielectric layer) 304 is formed on the dielectric layer 300. The dielectric layer 304 is planarized. Typically, silicon oxide is used to be the material of the dielectric layer 304. The dielectric layer 304 is formed by chemical vapor deposition, for example. As is known, the reflection may effect the resolution of the photolithography process. Therefore, to prevent the reflection occurred in the first conductive layer 302 in the following photolithography process. An anti-reflection layer (not shown) is formed on the dielectric layer 304. The anti-reflection layer can minimize reflection when photolithography operation is performed, and hence, it is capable of increasing the photolithography resolution.

In Fig, 3B, a first photoresist layer 306 having a first opening 303 therein is formed on the dielectric layer 304. An etching step is performed by using the photoresist layer 306 as an etching mask. A portion of the dielectric layer 304 is etched to form a trench 307 in a predetermined depth 305. A trench 307 is formed in the dielectric layer 304. The depth of the trench 307 is roughly equal to the thickness of a conductive line (metallic line) in a dual damascene structure (shown in FIG. 3E).

Figure 3C:
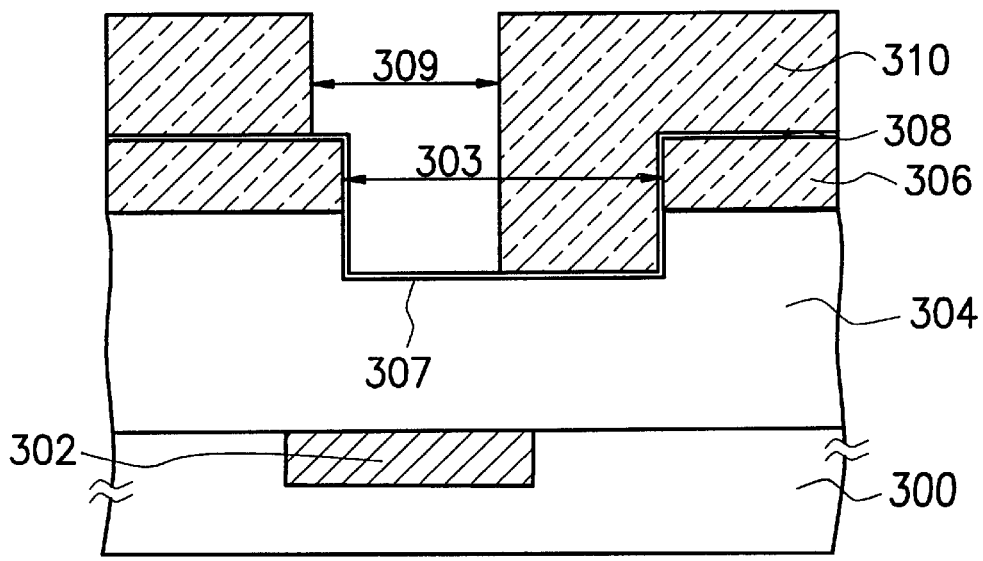

In FIG. 3C, A titanium (or titanium nitride) layer 308 is formed over the dielectric layer 300 to cover the first photoresist layer 306 and the dielectric layer 304. The titanium layer 308 is used as an anti-reflection layer to keep the first photoresist layer 306 from being destroyed in the following photolithography process. A second photoresist layer 310 having a second opening 309 is formed on the titanium layer 308. The second opening 309 and the first opening 303 are overlapped. The overlapped region is located just above the first conductive layer 302 and has the same width as a via hole (shown in FIG. 3D).

Figure 3D:
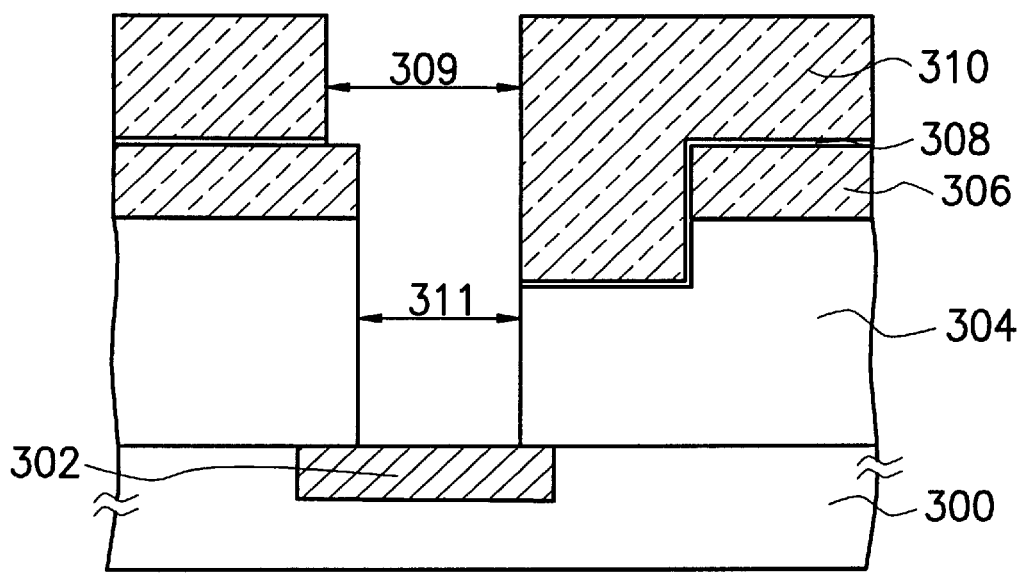

In FIG. 3D, an etching step is performed by using the second photoresist layer 310 and the first photoresist layer 306 as masks. The titanium layer 308 and the dielectric layer 304 are being etched until the first conductive layer 302 is exposed. A via hole 311 in the dielectric layer 304 is completed.

Figure 3E:
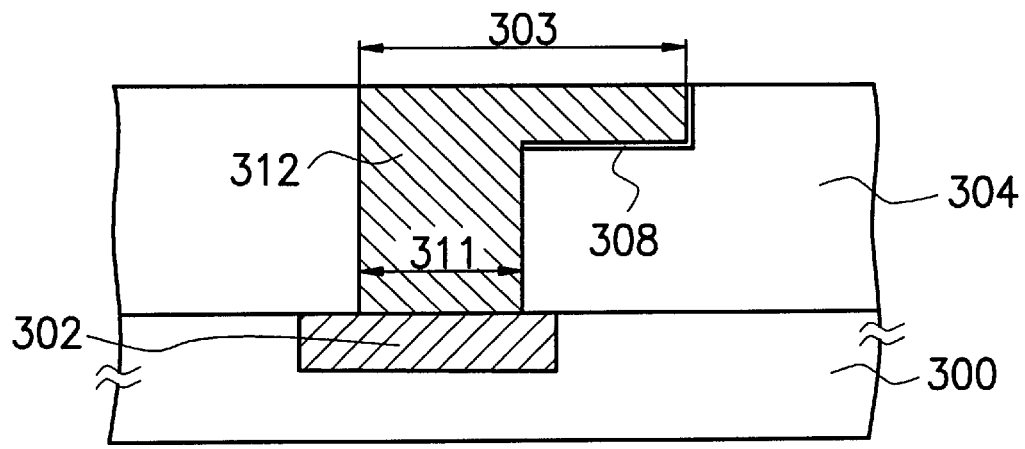

In FIG. 3E, the second photoresist layer 310 and the first photoresist layer 306 are removed. The lift-off effect may happen while removing the first photoresist layer 306 and the second photoresist layer 310. Thus, the titanium layer 308, which covers the first photoresist layer 306, is removed simultaneously. A second conductive layer (not shown) is formed on the dielectric layer 300 to fill the via hole 311 and the trench 303. A planarization step is performed to form a dual damascene structure 312. The material of the conductive layer can be, for example, aluminum or tungsten with a titanium/titanium nitride composite layer underneath serving as a barrier layer/glue layer. The planarization step can be performed by chemical-mechanical polishing to polish the conductive layer until exposing the dielectric layer 311.

In the process shown above according to one preferred embodiment of the invention, the step of forming the titanium (or titanium nitride) layer can be omitted. Because of the first photoresist layer 306 has been patterned in the photolithography process, the following photolithography process performed on the second photoresist layer will not damage the first photoresist layer 306.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, comprising the steps of:

forming a dielectric layer having a first conductive layer formed therein on a dielectric layer;

forming a first photoresist layer having a first opening therein;

using the first photoresist layer as an etching mask and etching the dielectric layer to form a trench with a predetermined depth;

forming a titanium layer over the dielectric layer to cover the first photoresist layer and the dielectric layer;

forming a second photoresist layer having a second opening therein on the titanium layer, wherein the first opening and the second opening are overlapped to etch other;

using the second photoresist layer and the first photoresist layer as masks and etching the titanium layer and the dielectric layer until exposing the first conductive layer to from a via hole;

removing the first photoresist layer and the second photoresist layer; wherein the titanium layer is removed simultaneously;

forming a second conductive layer to fill the via hole and the trench; and planarizing the second conductive layer until exposing the dielectric layer.

2. The method of claim 1, further comprising forming an anti-reflection layer before the step of forming the first photoresist layer.

3. The method of claim 2, wherein the overlapped region of the first opening and the second opening has the same width as the via hole and is located just above the first conductive layer.

4. A method of forming a dual damascene structure, comprising the steps of:

forming a dielectric layer having a first conductive layer therein on a dielectric layer;

forming a first photoresist layer having an first opening therein on the dielectric layer;

using the first photoresist layer as a mask and etching the dielectric layer to form a trench with a predetermined depth;

forming a titanium nitride layer on the dielectric layer to cover the first photoresist layer and the dielectric layer;

forming the second photoresist layer having a second opening therein on the titanium nitride layer, wherein the first opening and the second opening are overlapped to each other;

using the first photoresist layer and the second photoresist layer as masks and etching the titanium nitride layer and the dielectric layer to form a via hole until exposing the first conductive layer;

removing the first photoresist layer and the second photoresist layer, wherein the titanium nitride layer is removed simultaneously;

forming a second conductive layer to fill the via hole and the trench over the substrtate; and planarizing the second conductive layer until exposing the dielectric layer.

5. The method of claim 4, further comprising forming an anti-reflection layer before the step of forming the first photoresist layer.

6. The method of claim 4, wherein the overlapped region of the first opening and the second opening has the same width as the via hole and is located just above the first conductive layer.

* * * * *